(12) United States Patent
Li et al.

(10) Patent No.: US 9,581,644 B2
(45) Date of Patent: Feb. 28, 2017

(54) DIGITAL IC SIMULATION

(71) Applicant: INTERNATIONAL BUSINESS MACHINES CORPORATION, Armonk, NY (US)

(72) Inventors: De Xian Li, Shanghai (CN); Yufei Li, Shanghai (CN); Dan Liu, Beijing (CN); Yang Liu, Shanghai (CN)

(73) Assignee: GLOBALFOUNDRIES INC., Grand Cayman (KY)

(*) Notice: Subject to any disclaimer, the term of this patent is extended or adjusted under 35 U.S.C. 154(b) by 54 days.

(21) Appl. No.: 14/656,790

(22) Filed: Mar. 13, 2015

(65) Prior Publication Data

US 2015/0276872 A1 Oct. 1, 2015

(30) Foreign Application Priority Data

Mar. 31, 2014 (CN) .......................... 2014 1 0127820

(51) Int. Cl.
*G06F 17/50* (2006.01)
*G01R 31/3177* (2006.01)

(52) U.S. Cl.
CPC ....... *G01R 31/3177* (2013.01); *G06F 17/5022* (2013.01)

(58) Field of Classification Search
CPC .......................... G01R 31/3177; G06F 17/5022
USPC ......................................................... 716/106
See application file for complete search history.

(56) References Cited

U.S. PATENT DOCUMENTS 5,550,760 A * 8/1996 Razdan ............... G06F 17/5022
703/14
6,002,861 A * 12/1999 Butts ................... G06F 17/5027
703/15
6,604,065 B1 8/2003 Blomgren
8,296,699 B1 * 10/2012 Chetput ............. G06F 17/5022
716/106
8,683,400 B1 * 3/2014 O'Riordan .......... G06F 17/5022
703/13

(Continued)

OTHER PUBLICATIONS

Harish K. Chaudhry, Peter Eichenberger, Debashis Roy Chowdhury: Mix-2-2 Value, 1997 IEEE, pp. 77-82.

*Primary Examiner* — Jack Chiang
*Assistant Examiner* — Brandon Bowers
(74) *Attorney, Agent, or Firm* — David Cain; Andrew M. Calderon; Roberts Mlotkowski Safran Cole & Calderon, P.C.

(57) ABSTRACT

The present invention discloses a digital integrated circuit simulation method and simulator. The method comprises: obtaining a circuit diagram of the digital integrated circuit and a checkpoint in the circuit diagram; determining a point relevant to a boundary between a two-value simulation and a multi-value simulation in the circuit diagram and a state of the relevant point according to the checkpoint; determining a boundary position, as well as a boundary type of the boundary position, of the boundary between the two-value simulation and the multi-value simulation in the circuit diagram according to the relevant point and the state of the relevant point; inserting a conversion circuit at the boundary position according to the boundary type of the boundary position; and modeling and simulating the circuit diagram into which the conversion circuit is inserted. The method and simulator can reduce simulation time and the needed storage resources.

20 Claims, 6 Drawing Sheets

(56) References Cited

U.S. PATENT DOCUMENTS

2006/0123363 A1* 6/2006 Williams ............... B82Y 10/00
                                                      716/101
2010/0280814 A1   11/2010 Rabinovitch
2014/0005992 A1   1/2014  Deindl

* cited by examiner

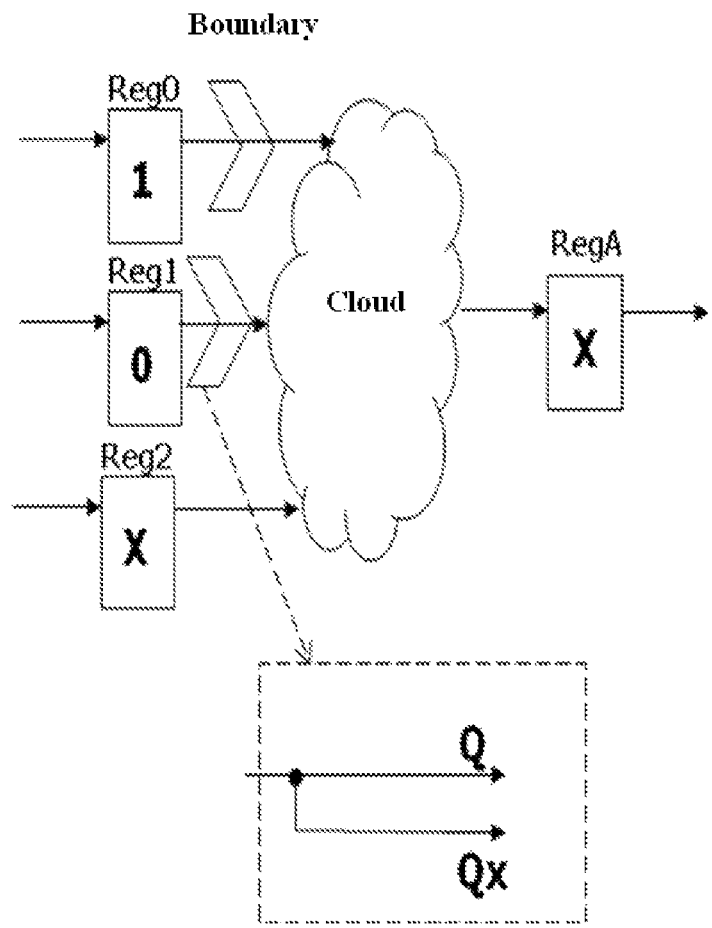
Fig. 7.1
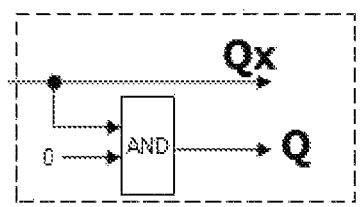
Fig. 7.2

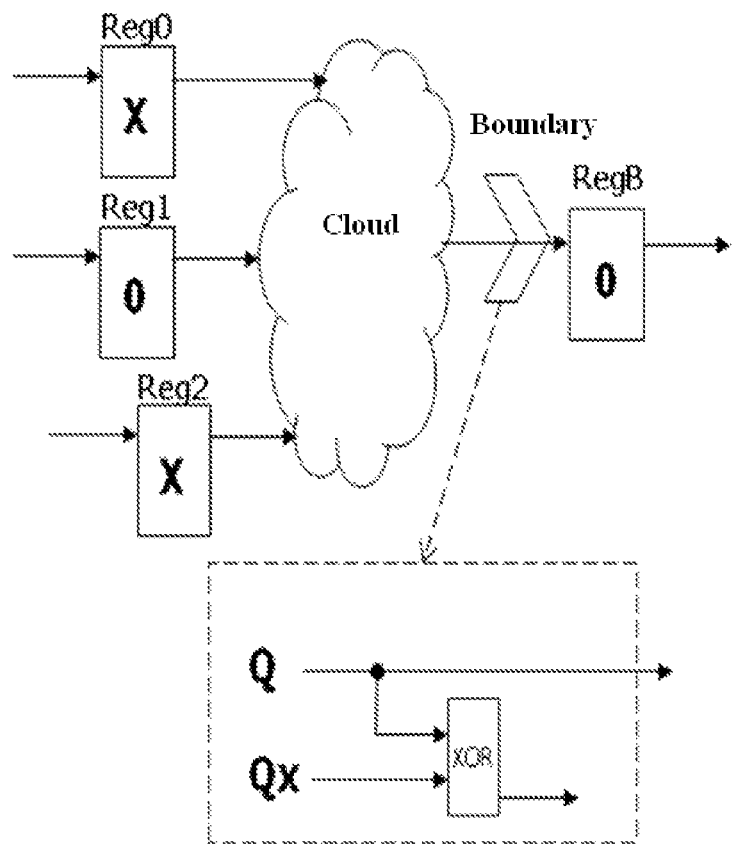
Fig. 8.1
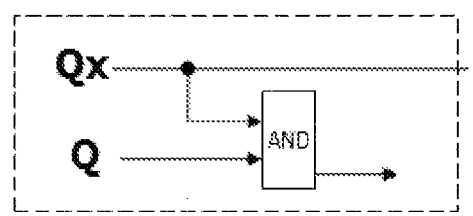
Fig. 8.2

DIGITAL IC SIMULATION

FIELD

The present invention relates to integrated circuits, and more specifically, to a digital IC simulation method and a simulator.

BACKGROUND

In digital IC design flow, functional verification usually takes 70% of the total design cycle, and 95% functional verification is based on simulation. Therefore time for simulation has a significant impact on an IC chip's TTM (time to market), and thus simulation speedup is very important for success of IC chip design.

At present common simulation tools in the industry include VCS by Synopsys company, NCSIM by Cadence company, etc. The IC simulation verification flow is as below: first, converting RTL description of the circuit into a format recognizable to some simulator, i.e. model processing; then, loading a model to a simulator. Later, test cases are applied at the input port, and the circuit behavior is simulated by the simulator; in the meanwhile, the circuit behavior is monitored using a reference model, and if the simulated circuit behavior does not match the reference model, then errors occur and are reported to verification engineer. Test cases are usually organized into test suites and run in batch mode. Successful test suites run require all test cases included pass. This regression process takes the longest simulation time.

Circuit descriptions for RTL (register-transfer level) simulation and gate-level simulation are descriptions of different abstraction levels of a digital circuit. Taking a simple AND gate as an example, the RTL description may be C=A & B, while the gate-level description is a concrete AND gate. All descriptions of these different abstraction levels may be regarded as descriptions of circuit diagram.

RTL simulation/gate-level simulation above includes a two-value simulation and a multi-value simulation. The two-value simulation refers to represent one logical bit with only binary value 0 and 1; the multi-value simulation refers to represent one logic bit by multiple values such as 0/1/X, etc. For example, in the above example of a simple AND gate, a truth table of the two-value simulation C=A+B is shown as Table 1.

TABLE 1

| C | A | B |
|---|---|---|
| 0 | 0 | 0 |
| 1 | 1 | 1 |
| 0 | 0 | 1 |
| 0 | 1 | 0 |

FIG. 2 shows a gate-level circuit model corresponding to the simple AND gate two-value simulation.

In the above example of a simple AND gate, a truth table of one implementation Cx=Ax+Bx of the multi-value simulation is shown as Table 2.

TABLE 2

| A | B | C | A | $A_X$ | B | $B_X$ | C | $C_X$ |
|---|---|---|---|---|---|---|---|---|
| 0 | 0 | 0 | 0 | 0 | 0 | 0 | 0 | 0 |
| 0 | 1 | 0 | 0 | 0 | 1 | 1 | 0 | 0 |
| 0 | X | 0 | 0 | 0 | 0 | 1 | 0 | 0 |
| 1 | 0 | 0 | 1 | 1 | 0 | 0 | 0 | 0 |
| 1 | 1 | 1 | 1 | 1 | 1 | 1 | 1 | 1 |
| 1 | X | X | 1 | 1 | 0 | 1 | 0 | 1 |
| X | 0 | 0 | 0 | 1 | 0 | 0 | 0 | 0 |
| X | 1 | X | 0 | 1 | 1 | 1 | 0 | 1 |
| X | X | X | 0 | 1 | 0 | 1 | 0 | 1 |

FIG. 3 shows a gate-level circuit model corresponding to the simple AND gate's multi-value simulation under the implementation in Table 2.

Real digital circuit run in multi-value so multi-value simulation is more accurate than 2-value simulation, while 2-value simulation runs much faster and has better performance. Table 3 shows a comparison between the two-value simulation and the multi-value simulation in modeling time, model scale and regression time during GPS-8 path digital IC design, wherein GPS-8 path digital IC design is merely a circuit having ordinary complexity. As seen from Table 3, the multi-value simulation model is complex; since the model scale is much larger, more memories are needed, and the regression time is longer.

TABLE 3

|  | two-value simulation | multi-value simulation | multiple relationship (multi-value/two-value) |
|---|---|---|---|
| modeling time | 90 seconds | 181 seconds | 2 times |
| model scale | 10 M gate | 30 M gate | 2 times |
| regression time | 237 seconds | 1833 seconds | 8 times |

SUMMARY

It is apparent that there is a need for a method and simulator capable of reducing simulation time and the needed storage resources while ensuring the correctness of functions of a digital IC chip.

According to one aspect of the present invention, there is provided a digital integrated circuit simulation method, comprising:

obtaining a circuit diagram of the digital integrated circuit and a checkpoint in the circuit diagram;

determining a point relevant to a boundary between a two-value simulation and a multi-value simulation in the circuit diagram and a state of the relevant point according to the checkpoint;

determining a boundary position, as well as a boundary type of the boundary position, of the boundary between the two-value simulation and the multi-value simulation in the circuit diagram according to the relevant point and the state of the relevant point;

inserting a conversion circuit at the boundary position according to the boundary type of the boundary position; and modeling and simulating the circuit diagram into which the conversion circuit is inserted.

According to another aspect of the present invention, there is provided a digital integrated circuit simulator, comprising:

an obtaining module configured to obtain a circuit diagram of the digital integrated circuit and a checkpoint in the circuit diagram;

a point and state determining module configured to determine a point relevant to a boundary between a two-value simulation and a multi-value simulation in the circuit diagram and a state of the relevant point according to the checkpoint;

a boundary and type determining module configured to determine a boundary position, as well as a boundary type of the boundary position, of the boundary between the two-value simulation and the multi-value simulation in the circuit diagram, according to the relevant point and the state of the relevant point;

an inserting module configured to insert a conversion circuit at the boundary position according to the boundary type of the boundary position; and a modeling and simulating module configured to model and simulate the circuit diagram into which the conversion circuit is inserted.

BRIEF DESCRIPTION OF THE SEVERAL VIEWS OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

FIG. 7.1 shows a diagram where a first conversion circuit in a first encoding mode is inserted into the circuit shown in FIG. 5;

FIG. 7.2 shows a diagram where a first conversion circuit in a second encoding mode is inserted into the circuit shown in FIG. 5;

FIG. 8.1 shows a diagram where a second conversion circuit in a first encoding mode is inserted into the circuit shown in FIG. 6;

FIG. 8.2 shows a diagram where a second conversion circuit in a first encoding mode is inserted into the circuit shown in FIG. 6;

DETAILED DESCRIPTION

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
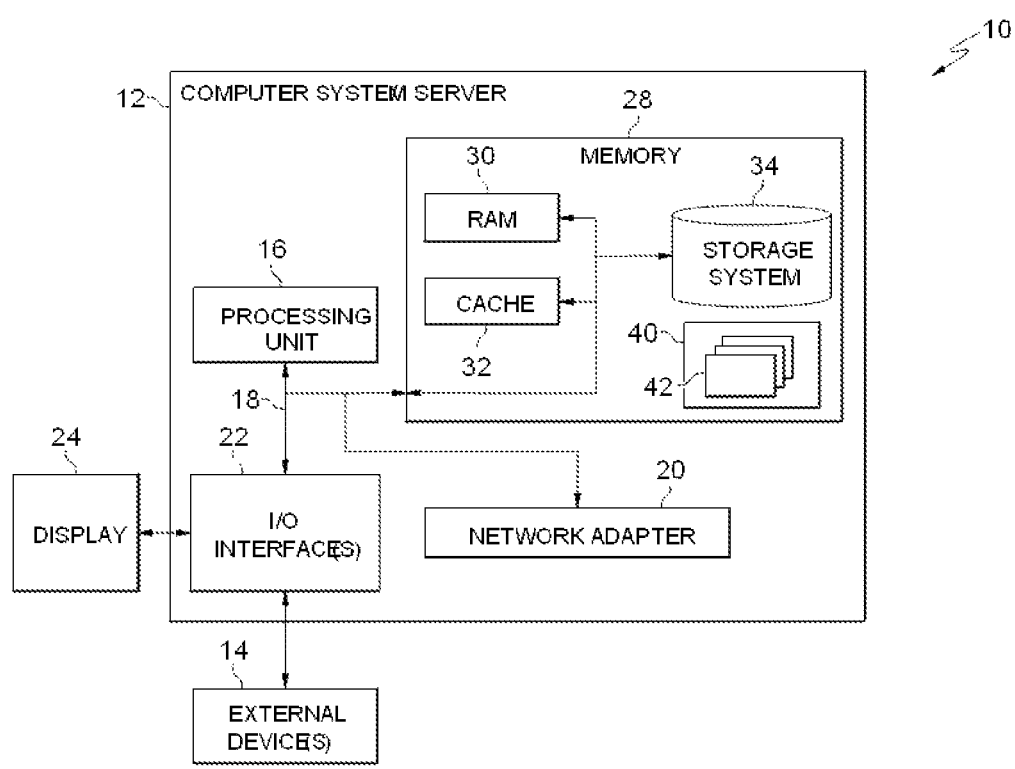
FIG. 1 shows a block diagram of an exemplary computer system/server 12 which is applicable to implement the embodiments of the present invention.
Figure 2:
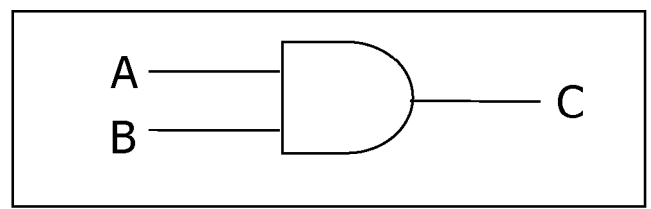
FIG. 2 shows a gate-level circuit model corresponding to a two-value simulation of a simple AND gate.
Figure 3:
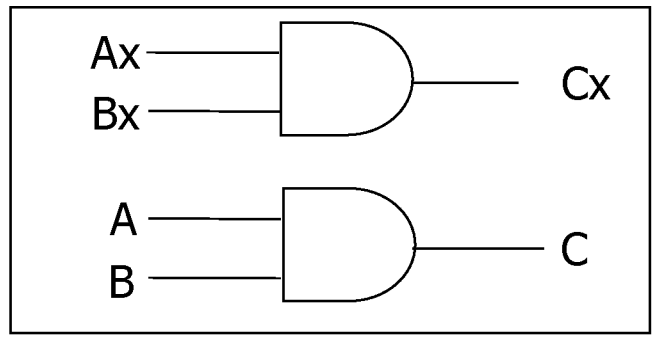
FIG. 3 shows a gate-level circuit model corresponding to multi-value simulation of a simple ANG gate under implementation of Table 2.

FIG. 1 shows a block diagram of an exemplary computer system/server 12 which is applicable to implement the embodiments of the present invention. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12;

and/or any devices (e.g., network card, modem, etc.) that enable computer system/server 12 to communicate with one or more other computing devices. Such communication can occur via Input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Table 4 shows the percentage of "X" points to all points after a real chip is power-on-set (POR) and the simulator circuit is stable. As seen from Table 4, most points still can use a two-value simulation, and only a handful of points need a multi-value simulation. Currently either two-value simulation or multi-value simulation is applied to all points throughout the entire simulation process, without taking concrete situation of these points into consideration. As a result, where a two-value simulation is used, although the speed is fast and small storage space is occupied, the simulation result is not accurate; where a multi-value simulation is used, although a more accurate simulation result is achieved, the simulation speed is slow and large storage space is occupied.

In the technical solution disclosed by the embodiment of the present invention, a mixture of a two-value simulation and a multi-value simulation is applied. Specifically, a boundary between the two-value simulation and the multi-value simulation is obtained with respect to a simulation circuit, then the two-value simulation is applied to points satisfying two-value simulation conditions at one side of the boundary and the multi-value simulation is applied to points satisfying multi-value simulation conditions on other side of the boundary, so that occupied storage space is reduced and simulation speed is enhanced on the premise of ensuring simulation correctness. Hereinafter, description is presented in an example where state being multi-value is state being three-value. Those skilled in the art may understand that multi-value is processed similarly.

TABLE 4

| | total of points | number of "X" points after POR | percentage of "X" points |
|---|---|---|---|
| Some chip (excluding PHY/HSS/CPU Complex/TB) | 3,529,806 | 175,951 | 4.98% |

Figure 4:
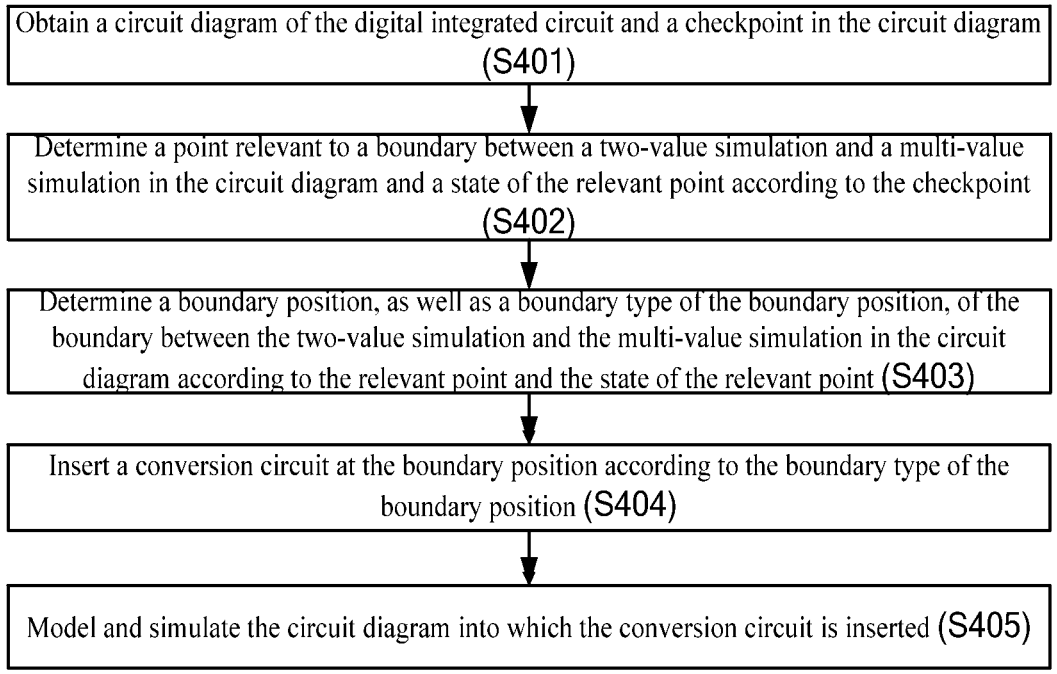
FIG. 4 schematically shows a flowchart of a digital integrated circuit multi-value simulation method according to one embodiment of the present invention.

FIG. 4 schematically shows a flowchart of a multi-value simulation method for a digital integrated circuit according to one embodiment of the present invention. According to FIG. 4, in step S401 a circuit diagram of the digital integrated circuit and a checkpoint in the circuit diagram are obtained; in step S402, a point relevant to a boundary between the two-value simulation and the multi-value simulation in the circuit diagram and state of the relevant point are determined according to the checkpoint; in step S403, a boundary position, as well as a boundary type of the boundary position, of the boundary between the two-value simulation and the multi-value simulation in the circuit diagram are determined according to the relevant point and the state of the relevant point; in step S404, a conversion circuit is inserted at the boundary position according to the boundary type of the boundary position; and in step S405, the circuit diagram into which the conversion circuit is inserted is modeled and simulated.

In step S401, a circuit diagram of the digital integrated circuit and a checkpoint in the circuit diagram can be obtained. Generally speaking, the integrated circuit design is described in HDL language; for example, Verilog and VHDL are two languages describing digital circuits, just as different programming languages for software design. First of all, a circuit diagram of the digital integrated circuit described in HDL language or other form is obtained; then, a multi-value model is built for the circuit diagram; later, a power-on-set (POR) simulation is applied to the model resulting a checkpoint. Regarding how to in detail build the multi-value model, run POR simulation on the model and obtain the checkpoint, this belongs to basic functions of an existing integrated circuit simulator, i.e., existing simulators can directly output checkpoints. Therefore, this is not detailed here.

A checkpoint may be construed as a snapshot of the circuit state at a certain moment. State of all points of the circuit at this moment is saved in the checkpoint; only by loading the checkpoint later, the circuit is placed in the same state, thereby avoiding wasting considerable simulation time during circuit initialization. The checkpoint includes a flip-flop, a combined logic gate, a wire, etc. The boundary check only needs to focus on the flip-flop and/or combined logic gate in the checkpoint.

In the embodiment of determining a point relevant to a boundary between a two-value simulation and a multi-value simulation in the circuit diagram and a state of the relevant point according to the checkpoint in step S402, there are two kinds of states of the point: two-value and multi-value. Points relevant to a boundary between a two-value simulation and a multi-value simulation are combined logic gates and/or flip-flops in the circuit diagram. Points may be all flop-flops, all combined logic gates, or partially combined logic gates and partially flip-flops. Points may select different granularities based on different demands; for example, all flip-flops in the circuit diagram may be selected as points, while the intermediate combined logic gates are ignored. In one embodiment, points relevant to a boundary between a two-value simulation and a multi-value simulation include an input point and its one upper level source point in the circuit diagram. Determining a point relevant to a boundary between a two-value simulation and a multi-value simulation in the circuit diagram and a state of the relevant point according to the checkpoint comprises: determining an input point and its one upper level source point in the circuit diagram; and marking a state of the input point and a state of the one upper level source point according to the checkpoint.

In determining an input point and its one upper level source point in the circuit diagram, it is possible to trace from the output end to the input end of the circuit diagram and take a traced first-level point as the input point and a second-level point as the one upper level source point; when the second-level point is taken as the input point, then a further traced third-level point is further taken as a one upper level source point, and so on and so forth. Therefore, starting from the output, the traced first-level point can only act as the input point, the traced last-level point (further traced will be the input of the circuit) can only act as a one upper level source point, and other points may act as either an input point or a one upper level source point. For example, traced points are in an order as: A→B, B→C, at which point B is a one upper level source point of A but is an input point of C.

In determining an input point and its one upper level source point in the circuit diagram, it is also possible to trace from the input end to the output end of the circuit diagram, taking a traced first-level point as the one upper level source point and a second-level point as the input point, and so on and so forth.

After determining an input point and a one upper level source point, it is possible to mark state of the input point and the one upper lever source point as two-value or multi-value according to the state recorded in the checkpoint.

In one embodiment of determining a boundary position, as well as a boundary type of the boundary position, of the boundary between the two-value simulation and the multi-value simulation in the circuit diagram according to the relevant point and the state of the relevant point in step S403, first of all it is judged whether the state of the input point is the same as the state of the one upper level source point; then, in response to the state of the input point being different from the state of the one upper level source point, a boundary position is determined as between the one upper level source point and the input point. For example, if the state of the one upper level source point is two-value and the state of the input point is multi-value, then a boundary position is determined as between the one upper level source point and the input point.

Determining boundary type of the boundary position comprises: in response to the state of the input point being multi-value and the state of the one upper level source point being two-value at the boundary position, the boundary type of the boundary position being two-value-to-multi-value, T-to-M; in response to the state of the input point being two-value and the state of the one upper level source point being multi-value at the boundary position, the boundary type of the boundary position being multi-value-to-two-value, M-to-T. Regarding the boundary type being T-to-M, a mark for the boundary type may be added at the output of the one upper level source point; regarding the boundary type being M-to-T, the mark for the boundary type may be added at the input of the input point, just like marks shown at the last column of the table.

Figure 5:
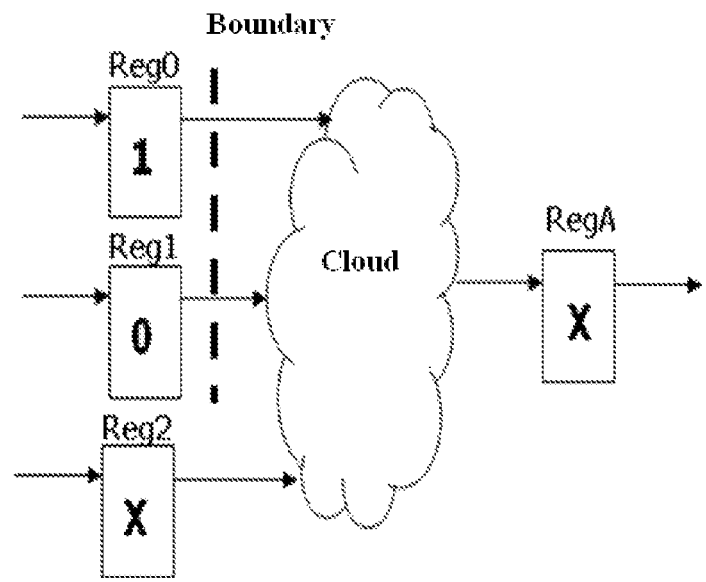
FIG. 5 shows a schematic circuit of T-to-M boundary type.

For example, FIG. 5 shows a schematic circuit of T-to-M boundary type, wherein points are flip-flops. According to the above steps, first of all an input flip-flop RegA is determined, and all one upper level source flip-flops Reg0, Reg1 and Reg2 are found by backward tracing; by comparing the states of Reg0, Reg1 and Reg2 with the state of RegA, it is found that the states of Reg0 and Reg1 are two-value while the state of RegA is multi-value, and then two entries describing a two-value and a multi-value simulation boundary as shown in Table 5 are obtained, including a boundary position and a boundary type. The states of both Reg2 and RegA are multi-value, so no such entries exist in Table 5. However, Table 5 is merely an exemplary way for representing simulation boundary, and those skilled in the art may appreciate any other data forms may be used to represent boundary positions, such as a chain array, an array, etc. Also, forward tracing may be applied to FIG. 5, and still two entries describing a two-value and a multi-value simulation boundary as shown in Table 5 are obtained.

TABLE 5

| input point | one upper level source point | type of input point | type of the one upper level source point | mark of boundary type |
|---|---|---|---|---|
| RegA | Reg0 | multi-value | two-value | T-to-M@source output |
| RegA | Reg1 | multi-value | two-value | T-to-M@source output |

Figure 6:
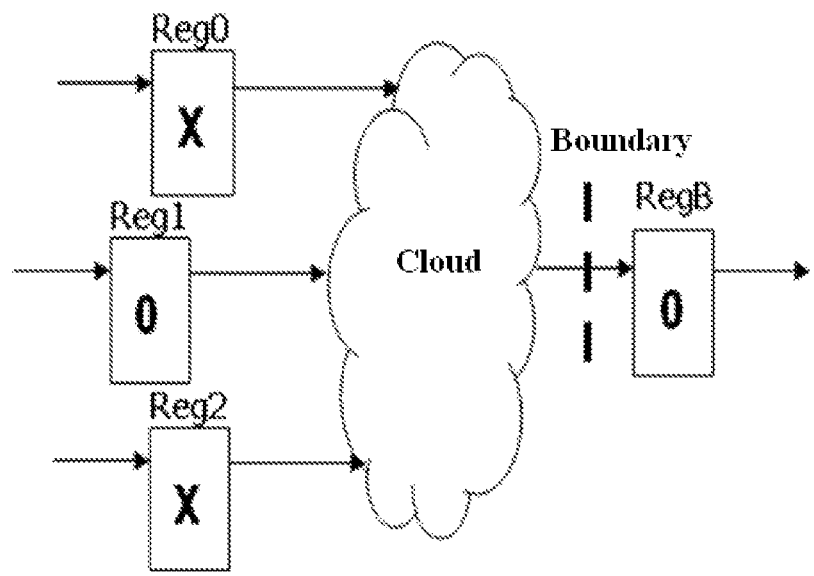
FIG. 6 shows a schematic circuit of M-to-T boundary type.

FIG. 6 shows a schematic circuit of M-to-T boundary type, wherein points are flip-flops. According to FIG. 6, the state of an input flip-flop RegB is determined as two-value, and all its one upper level source flip-flops Reg0, Reg1 and Reg2 are found by backward tracing; by comparing the states of Reg0, Reg1 and Reg2 with the state of RegB, it is found that the states of Reg0 and Reg2 are multi-value while the state of RegB is two-value, and then two simulation boundaries are determined as between RegB and Reg0, and as between RegB and Reg2; meanwhile, a mark of M-to-T boundary type is added at the input of RegB, as shown in Table 6. However, Table 6 is merely an exemplary way for representing simulation boundary, and those skilled in the art may appreciate any other data forms may be used to represent boundary positions, such as a chain array, an array, etc. Also, forward tracing may be applied to FIG. 6, and still two entries describing a two-value and a multi-value simulation boundary as shown in Table 6 are obtained.

If the state of the one upper level source point is the same as state of the input point, then relevant analysis of the input point ends and the flow continues to analyze the next input point.

In one embodiment, a plurality of boundary entries may form a boundary file, which may be stored in a table or other file forms such as an XML file, a text file and so on.

TABLE 6

| input point | one upper level source point | type of input point | type of the one upper level source point | mark of boundary type |
|---|---|---|---|---|
| RegB | Reg0/Reg1 | two-value | multi-value | M-to-T@sink input |

In step S404, a conversion circuit is inserted at the boundary position according to the boundary type of the boundary position. Specifically, in response to the boundary type of the boundary position being T-to-M, a first conversion circuit is inserted at the output end of a one upper level source point of the boundary position, the first conversion circuit being a conversion circuit generating a corresponding multi-value signal according to a two-value signal outputted by the one upper level source point; in response to the boundary type of the boundary position being M-to-T, a second conversion circuit is inserted at the input end of an input point of the boundary position, the second conversion circuit being a conversion circuit generating a corresponding two-value signal according to a multi-value signal of the input end of the input point. Since different simulators vary in two-value and multi-value modeling and coding ways, the concrete first and second conversion circuits are obtained according to concrete implementations of the simulator.

Hereinafter, suppose the multi-value is 3-value. As in a two-value circuit a 1-bit signal is represented using a 1-bit numeric value, and in a multi-value circuit a 1-bit signal is represented using a multi-bit numeric value, it is supposed that the simulator uses a 2-bit numeric value to represent a 3-value circuit.

Let in a first encoding mode 00 represents 0, 11 represents 1, 01 represents X, then the first conversion circuit needs to replicate two-value point output (Q and Qx, wherein Qx replicates Q) to produce a corresponding multi-value. FIG. 7.1 shows a diagram where a first conversion circuit (a circuit in a dashed box) in the corresponding first encoding mode is inserted into the circuit shown in FIG. 5.

Let in a second encoding mode 00 represents 0, 01 represents 1, and 11 represents X, then in the conversion circuit Qx is generated directly by a two-value point output and Q is generated by the result of a two-value point output AND value of 0. FIG. 7.2 shows a diagram where a first conversion circuit in the corresponding second encoding mode is inserted into the circuit shown in FIG. 5.

Similarly, still using the first encoding mode mentioned above, the second conversion circuit only needs to directly use one of 1-bit numeric value (e.g., using Q only) for two-value calculation. FIG. 8.1 shows a diagram where a second conversion circuit (a circuit in a dashed box) in the corresponding first encoding mode is inserted into the circuit shown in FIG. 6.

Similarly, still using the second encoding mode mentioned above, the second conversion circuit only needs to directly use the value of Qx for two-value calculation. FIG. 8.2 shows a diagram where a second conversion circuit in the corresponding first encoding mode is inserted into the circuit shown in FIG. 6.

Moreover, in one embodiment, in response to the boundary type of the boundary position being M-to-T, an X detection further needs to be performed at the second conversion circuit, wherein an X detection is for monitoring whether an X exists at the input end of an input point of the second conversion circuit, and if an X exists, then the boundary position is determined to be expanded. Here, since different simulators vary in concrete two-value and multi-value modeling and encoding modes, concrete implementation of the X detection circuit is obtained according to concrete implementation of the simulator. Here, the second conversion circuit in a dashed box in FIGS. 8.1 and 8.2 includes an X detection circuit. If the boundary position is expanded, then a boundary position of a boundary between the two-value simulation and the multi-value simulation in the circuit diagram and the boundary type thereof need to be re-determined. That is, relevant steps in FIG. 4 need to be re-executed.

Figure 9:
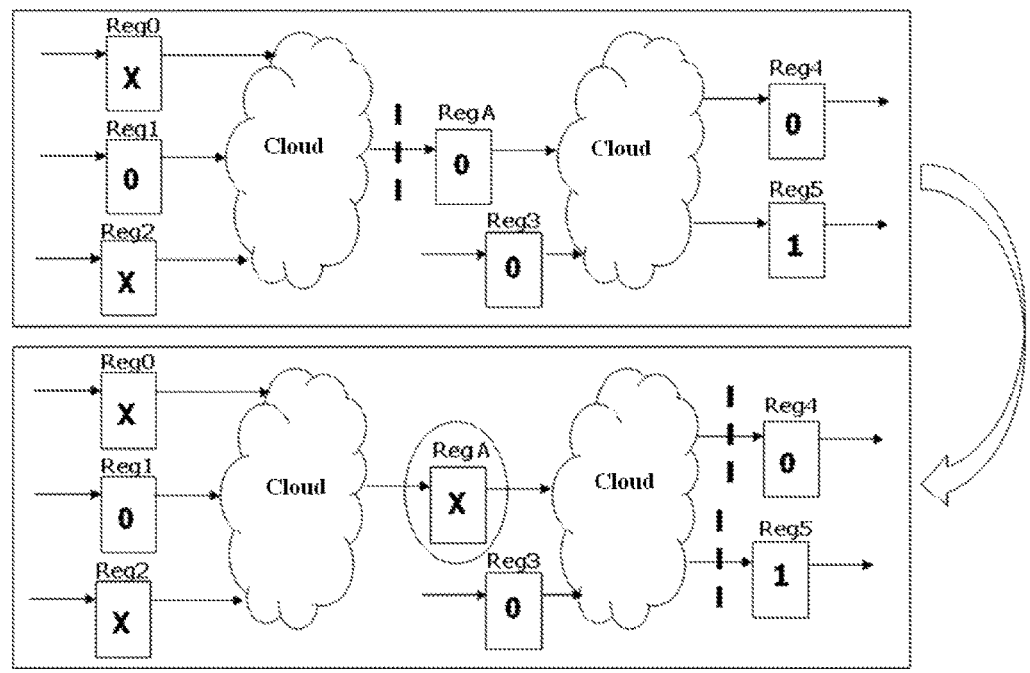
FIG. 9 shows an example where an X detection circuit judges the boundary is expanded.

FIG. 9 shows an example where an X detection circuit judges boundary expansion. After one regression test, an X detection circuit inserted at the input of RegA finds that the input of RegA changes from 0 to X, i.e., state of the boundary's input point changes from two-value to multi-value. At this point, a boundary position of a boundary between two-value simulation and multi-value simulation of the digital integrated circuit and the boundary type thereof need to be re-determined. In FIG. 9, when RegA is regarded as an input point, the state of RegA is multi-value and the states of one upper level source points Reg0 and Reg2 are multi-value, so an original M-to-T boundary at the input of RegA needs to be removed; when Reg4 and Reg5 are regarded as input points, since the states of Reg4 and Reg5 are two-value and the state of the source point RegA is multi-value, a boundary entry of M-to-T boundary type needs to be added at respective inputs of Reg4 and Reg5.

In the embodiment of simulating the digital integrated circuit into which the conversion circuit is inserted in step S404, if a boundary expansion does not occur in the digital integrated circuit, then the digital integrated circuit can be modeled and simulated normally, and a simulation result is outputted. If a boundary expansion occurs, then a boundary position of a boundary between the two-value simulation and the multi-value simulation of the digital integrated circuit and the boundary type thereof need to be re-determined, and later when the boundary expansion does not occur any more, modeling and simulation may be implemented normally.

Figure 10:
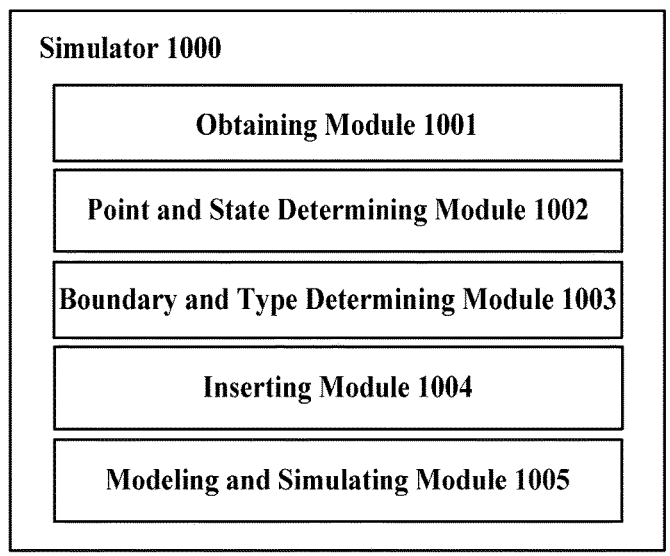
FIG. 10 shows a structural block diagram of a digital integrated circuit simulator according to one embodiment of the present invention.

Under the same inventive concept, the present invention further discloses a digital integrated circuit simulator. FIG. 10 shows a structural block diagram of a digital integrated circuit simulator 1000 according to one embodiment of the present invention. According to FIG. 10, simulator 1000 comprises: an obtaining module 1001 configured to obtain a circuit diagram of the digital integrated circuit and a checkpoint in the circuit diagram; a point and state determining module 1002 configured to determine a point relevant to a boundary between a two-value simulation and a multi-value simulation in the circuit diagram and a state of the relevant point according to the checkpoint; a boundary and type determining module 1003 configured to determine a boundary position, as well as a boundary type of the boundary position, of the boundary between the two-value simulation and the multi-value simulation in the circuit diagram according to the relevant point and the state of the relevant point; an inserting module 1004 configured to insert a conversion circuit at the boundary position according to the boundary type of the boundary position; and a modeling and simulating module 1005 configured to model and simulate the circuit diagram into which the conversion circuit is inserted, wherein the state of the point is two-value or multi-value, and the point relevant to the boundary between the two-value simulation and the multi-value simulation is a combined logic gate and/or flip-flop in the circuit diagram.

In one embodiment, the point relevant to the boundary between the two-value simulation and the multi-value simulation comprises an input point and its one upper level source point in the circuit diagram, and the point and state determining module comprises: a point determining module (not shown in FIG. 10) configured to determine an input point and its one upper level source point in the circuit diagram; and a state determining module (not shown in FIG. 10) configured to mark a state of the input point and a state of the one upper level source point according to the checkpoint.

In one embodiment, the boundary and type determining module comprises: a judging module (not shown in FIG. 10) configured to judge whether the state of the input point is the same as the state of the one upper level source point; and a boundary determining module (not shown in FIG. 10) configured to, in response to the state of the input point differing from the state of the one upper level source point, determine a boundary position as between the one upper level source point and the input point.

In one embodiment, the point determining module may trace from the output end to the input end of the circuit diagram, wherein a traced first-level point is the input point and a second-level point is the one upper level source point; or the point determining module traces from the input end to the output end of the circuit diagram, wherein a traced first-level point is the one upper level source point and a second-level point is the input point.

In one embodiment, the boundary and type determining module comprises: a type determining module (not shown in FIG. 10) configured to, in response to the state of the input point being multi-value and the state of the one upper level source point being two-value at the boundary position, determine the boundary type of the boundary position as two-value-to-multi-value, T-to-M; and in response to the state of the input point being two-value and the state of the one upper level source point being multi-value at the boundary position, determine boundary type of the boundary position as multi-value-to-two-value, M-to-T.

In one embodiment, the inserting module comprises: a first inserting module (not shown in FIG. 10) configured to, in response to the boundary type of the boundary position being T-to-M, insert a first conversion circuit at the output end of the one upper level source point of the boundary position, wherein the first conversion circuit is a conversion circuit generating a corresponding multi-value signal according to a two-value signal outputted by the one upper level source point; and a second inserting module (not shown in FIG. 10) configured to, in response to the boundary type of the boundary position being M-to-T, insert a second conversion circuit at the input end of the input point of the boundary position, wherein the second conversion circuit is a conversion circuit generating a corresponding two-value signal according to a multi-value signal of the input of the input point.

In one embodiment, in response to the boundary type of the boundary position being M-to-T, the second conversion circuit further comprises an X detection circuit, wherein the X detection circuit is for monitoring whether an X exists at the input end of an input point of the second conversion circuit, and if an X exists, the boundary position is determined to be expanded.

In one embodiment, the simulator further comprises a boundary expansion handling module configured to, in response to the boundary position is determined to be expanded, re-determine a boundary position, as well as a boundary type of the boundary position, of a boundary between the two-value simulation and the multi-value simulation in the circuit diagram.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A digital integrated circuit simulation method, comprising:
    obtaining, by a computing device, a circuit diagram of the digital integrated circuit, as described in a computing language, and a checkpoint in the circuit diagram;
    determining, by the computing device, a point relevant to a boundary between a two-value simulation and a multi-value simulation in the circuit diagram and a state of the relevant point according to the checkpoint, the two-value simulation being representative of a one logical bit with only binary value 0 and 1 and the multi-value simulation being representative of a one logic bit by multiple values;
    determining, by the computing device, a boundary position, as well as a boundary type of the boundary position, of the boundary between the two-value simulation and the multi-value simulation in the circuit diagram according to the relevant point and the state of the relevant point;
    inserting, by the computing device, a conversion circuit at the boundary position according to the boundary type of the boundary position; and
    modeling and simulating, by the computing device, the circuit diagram into which the conversion circuit is inserted.

2. The method according to claim 1, wherein the state of the relevant point is one of:
    two-value;
    multi-value.

3. The method according to claim 1, wherein the point relevant to the boundary between the two-value simulation and the multi-value simulation is at least one of the following devices in the circuit diagram:
    a combined logic gate;
    a flip-flop.

4. The method according to claim 3, wherein the point relevant to the boundary between the two-value simulation and the multi-value simulation comprises an input point and its one upper level source point in the circuit diagram, and the determining a point relevant to a boundary between a two-value simulation and a multi-value simulation in the circuit diagram and a state of the relevant point according to the checkpoint comprises:
    determining an input point and its one upper level source point in the circuit diagram; and
    marking a state of the input point and a state of the one upper level source point according to the checkpoint.

5. The method according to claim 4, wherein the determining a boundary position of the boundary between the two-value simulation and the multi-value simulation in the circuit diagram according to the relevant point and the state of the relevant point comprises:
    judging whether the state of the input point is the same as the state of the one upper level source point; and
    in response to the state of the input point differing from the state of the one upper level source point, determining a boundary position as between the one upper level source point and the input point.

6. The method according to claim 5, wherein the determining an input point and its one upper level source point in the circuit diagram comprises one of the following methods:
    tracing from the output end to the input end of the circuit diagram, wherein a traced first-level point is the input point and a second-level point is the one upper level source point;
    tracing from the input end to the output end of the circuit diagram, wherein a traced first-level point is the one upper level source point and a second-level point is the input point.

7. The method according to claim 5, wherein the determining a boundary type of the boundary position comprises:
    in response to the state of the input point being multi-value and the state of the one upper level source point being two-value at the boundary position, determining the boundary type of the boundary position as two-value-to-multi-value, T-to-M;
    in response to the state of the input point being two-value and the state of the one upper level source point being multi-value at the boundary position, determining the boundary type of the boundary position as multi-value-to-two-value, M-to-T.

8. The method according to claim 7, wherein the inserting a conversion circuit at the boundary position according to the boundary type of the boundary position comprises:
    in response to the boundary type of the boundary position being T-to-M, inserting a first conversion circuit at the output end of the one upper level source point of the boundary position, wherein the first conversion circuit is a conversion circuit generating a corresponding multi-value signal according to a two-value signal outputted by the one upper level source point;

in response to the boundary type of the boundary position being M-to-T, inserting a second conversion circuit at the input end of the input point of the boundary position, wherein the second conversion circuit is a conversion circuit generating a corresponding two-value signal according to a multi-value signal of the input of the input point.

9. The method according to claim 8, wherein in response to the boundary type of the boundary position being M-to-T, an X detection is further required at the second conversion circuit, wherein the X detection is for monitoring whether an X exists at the input end of an input point of the second conversion circuit; and if an X exists, the boundary position is determined to be expanded.

10. The method according to claim 9, further comprising: in response to the boundary position is determined to be expanded, re-determining a boundary position, as well as a boundary type of the boundary position, of a boundary between the two-value simulation and the multi-value simulation in the circuit diagram.

11. A digital integrated circuit simulator which is implemented in a computing device, comprising:
an obtaining module configured to obtain a circuit diagram of the digital integrated circuit, as described in a computing language, and a checkpoint in the circuit diagram;
a point and state determining module configured to determine a point relevant to a boundary between a two-value simulation and a multi-value simulation in the circuit diagram and a state of the relevant point according to the checkpoint, the two-value simulation being representative of a one logical bit with only binary value 0 and 1 and the multi-value simulation being representative of a one logic bit by multiple values;
a boundary and type determining module configured to determine a boundary position, as well as a boundary type of the boundary position, of the boundary between the two-value simulation and the multi-value simulation in the circuit diagram according to the relevant point and the state of the relevant point;
an inserting module configured to insert a conversion circuit at the boundary position according to the boundary type of the boundary position; and
a modeling and simulating module configured to model and simulate the circuit diagram into which the conversion circuit is inserted.

12. The simulator according to claim 11, wherein the state of the relevant point is one of:
two-value;
multi-value.

13. The simulator according to claim 11, wherein the point relevant to the boundary between the two-value simulation and the multi-value simulation is at least one of the following devices in the circuit diagram:
a combined logic gate;
a flip-flop.

14. The simulator according to claim 13, wherein the point relevant to the boundary between the two-value simulation and the multi-value simulation comprises an input point and its one upper level source point in the circuit diagram, and the point and state determining module comprises:
a point determining module configured to determine an input point and its one upper level source point in the circuit diagram; and a state determining module configured to mark a state of the input point and a state of the one upper level source point according to the checkpoint.

15. The simulator according to claim 14, wherein the boundary and type determining module comprises:
a judging module configured to judge whether the state of the input point is the same as the state of the one upper level source point; and
a boundary determining module configured to, in response to the state of the input point differing from the state of the one upper level source point, determine a boundary position as between the one upper level source point and the input point.

16. The simulator according to claim 15, wherein the point determining module uses one of the following methods:
tracing from the output end to the input end of the circuit diagram, wherein a traced first-level point is the input point and a second-level point is the one upper level source point;
tracing from the input end to the output end of the circuit diagram, wherein a traced first-level point is the one upper level source point and a second-level point is the input point.

17. The simulator according to claim 15, wherein the boundary and type determining module comprises:
a type determining module configured to, in response to the state of the input point being multi-value and the state of the one upper level source point being two-value at the boundary position, determine the boundary type of the boundary position as two-value-to-multi-value, T-to-M; and in response to the state of the input point being two-value and the state of the one upper level source point being multi-value at the boundary position, determine the boundary type of the boundary position as multi-value-to-two-value, M-to-T.

18. The simulator according to claim 17, wherein the inserting module comprises:
a first inserting module configured to, in response to the boundary type of the boundary position being T-to-M, insert a first conversion circuit at the output end of the one upper level source point of the boundary position, wherein the first conversion circuit is a conversion circuit generating a corresponding multi-value signal according to a two-value signal outputted by the one upper level source point;
a second inserting module configured to, in response to the boundary type of the boundary position being M-to-T, insert a second conversion circuit at the input end of the input point of the boundary position, wherein the second conversion circuit is a conversion circuit generating a corresponding two-value signal according to a multi-value signal of the input of the input point.

19. The simulator according to claim 18, wherein in response to the boundary type of the boundary position being M-to-T, the second conversion circuit further comprises an X detection circuit, wherein the X detection circuit is for monitoring whether an X exists at the input end of an input point of the second conversion circuit, and if an X exists, the boundary position is determined to be expanded.

20. The simulator according to claim 19, further comprising: a boundary expansion handling module configured to, in response to the boundary position is determined to be expanded, re-determine a boundary position, as well as a boundary type of the boundary position, of a boundary between the two-value simulation and the multi-value simulation in the circuit diagram.

* * * * *